US006911230B2

(12) United States Patent
Kanzler

(10) Patent No.: US 6,911,230 B2
(45) Date of Patent: *Jun. 28, 2005

(54) PLATING METHOD

(75) Inventor: Miriana Kanzler, Bayshore, NY (US)

(73) Assignee: Shipley Company, L.L.C., Marlborough, MA (US)

(*) Notice: Subject to any disclaimer, the term of this patent is extended or adjusted under 35 U.S.C. 154(b) by 94 days.

This patent is subject to a terminal disclaimer.

(21) Appl. No.: 10/303,687

(22) Filed: Nov. 23, 2002

(65) Prior Publication Data

US 2004/0018308 A1 Jan. 29, 2004

Related U.S. Application Data

(60) Provisional application No. 60/340,645, filed on Dec. 14, 2001.

(51) Int. Cl.$^7$ .............................. B05D 1/18; B05D 1/36; B05D 3/10
(52) U.S. Cl. ..................... 427/125; 427/304; 427/404; 427/436; 427/437; 427/443.1
(58) Field of Search ................................. 427/125, 304, 427/305, 404, 405, 436, 437, 443.1

(56) References Cited

U.S. PATENT DOCUMENTS

| 3,162,512 | A | * | 12/1964 | Robinson | 428/670 |
| 3,597,834 | A | * | 8/1971 | Lathrop et al. | 438/625 |
| 4,481,035 | A | | 11/1984 | Andrascek et al. | |
| 5,143,544 | A | | 9/1992 | Iantosca | |
| 5,206,055 | A | * | 4/1993 | Iacovangelo | 427/304 |
| 5,302,278 | A | | 4/1994 | Nobel et al. | |
| 5,470,381 | A | * | 11/1995 | Kato et al. | 106/1.23 |
| 5,536,908 | A | | 7/1996 | Etchells et al. | |
| 6,165,912 | A | * | 12/2000 | McConnell et al. | 438/758 |
| 6,776,828 | B2 | * | 8/2004 | Kanzler et al. | 106/1.23 |

FOREIGN PATENT DOCUMENTS

| EP | 0 701 281 | | 3/1996 |
| EP | 1 021 593 | | 12/2001 |
| EP | 1021593 | * | 12/2001 |

* cited by examiner

Primary Examiner—Michael Cleveland
(74) Attorney, Agent, or Firm—John J. Piskorski

(57) ABSTRACT

Disclosed are methods of depositing electroless gold layers on a metal substrate using a catalytic palladium deposit. Such electroless gold layers have increased adhesion as compared to conventional electroless gold deposits.

10 Claims, No Drawings

PLATING METHOD

CROSS-REFERENCE TO RELATED APPLICATIONS

This application claims the benefit under 35 U.S.C. §119 (e) of U.S. Provisional Application No. 60/340,645, filed Dec. 14, 2001, the entire contents of which are incorporated herein by reference.

BACKGROUND OF THE INVENTION

The present invention relates generally to the field of electroless metal plating. In particular, the present invention relates to the field of electroless gold plating.

Immersion or displacement plating is an electroless plating process, but is given a separate classification in the art. In immersion plating, deposition is by displacement of an elemental metal from a substrate by metal ions in a plating solution. In electroless plating deposition takes place primarily by autocatalytic reduction of metal ions from solution. Such electroless plating requires the presence of a reducing agent.

Immersion plating does not employ an external electric current but rather is an electrochemical displacement reaction which is driven by the position of the substrate metal in the electromotive series relative to the metal to be deposited from solution. Plating occurs when the dissolved metal ions in a plating bath are displaced by a more active (less noble) metal that is contacted with the plating bath.

In the manufacture of printed wiring boards, solderable finishes are typically applied to printed wiring board substrates having pads and/or through holes exposed through a mask, such as a soldermask. Such solderable finishes are often applied by immersion plating as electroless plating can also deposit metal on the surface of the mask, which is undesirable. As an immersion plating reaction is driven by the difference in electrochemical potentials, plating will only occur at areas of exposed metal. For example, U.S. Pat. No. 5,143,544 (Iantosca) discloses a solution for immersion plating a tin-lead alloy suitable as a solderable finish on a printed wiring board substrate. However, there is a growing demand for more environmentally acceptable alternatives to lead for use in printed wiring board manufacture. Thus, the use of lead and lead alloys in electronic components faces an uncertain future. See, for example, U.S. Pat. No. 5,536,908 (Etchells et al.).

Gold is a more environmentally acceptable alterative to lead and has long been used in the electronics industry as a metal for contact surfaces because of its low electrical resistivity and its inertness to attack by corrosive substances. Such gold deposits have typically been plated using electroless or immersion gold plating baths. In particular, gold has long been used over a nickel undercoat to provide a solderable finish. Typically, the nickel undercoat is electrolessly applied while the gold is immersion deposited. Such processes are referred to as electroless-nickel-immersion-gold or "ENIG."

Electroless gold plating baths contain a reducing agent. Typical reducing agents are thiourea and alkyl thiourea derivatives, enol-containing compounds such as ascorbic acid (see U.S. Pat. No. 4,481,035 to Andrascek et al.), and boron-containing compounds such as alkylboranes and borohydrides. These conventional plating baths have certain drawbacks. For example, baths containing thiourea as the reducing agent must be heated to about 80° to 90° C. in order to achieve acceptable deposition rates. Such temperatures are too high for use with some electronics packaging materials. Also, at such temperatures the plating solutions can become unstable and spontaneously form fine particles of gold throughout the solution instead of producing gold deposits only on the desired substrate. When boron-containing compounds are used as the reducing agent, such compounds first undergo a hydrolysis reaction whose rate increases with temperature. Much of the boron-containing reducing agent is consumed in undesired side reactions making control of its concentration quite difficult.

One conventional form of electroless gold plating bath is thiosulfate ion based, stabilized with sulfite ions. Such baths are typically unstable when operated at a pH of 6 or below as sulfur dioxide is liberated from the bath under these pH conditions. It is known that the thiosulfate ion decomposes in acid solution to give elemental sulfur and sulfite ions. When an aqueous solution of sodium thiosulfate is adjusted to a pH of about 4 to 5, the solution will turn cloudy due to the formation of elemental sulfur. However, if sodium sulfite is also added to the above solution, elemental sulfur will not form and the solution will be stable and clear. Sodium sulfite has, therefore, been used in prior art metal plating solutions and sodium thiosulfate to stabilize the solution. The problem with using sodium sulfite, however, is that the sulfite ion itself is not stable in mildly acidic solutions, such that sulfur dioxide is slowly formed and liberated from the solution. The more acidic the solution, the faster the rate of sulfur dioxide formation will be. This leads to high consumption of sodium sulfite and instability of the metal thiosulfate complex in acidic solutions.

Immersion gold plating baths avoid many of the above reducing agent-derived drawbacks. However, such immersion plating baths typically require high plating temperatures, such as about 70° C. or greater, for proper operation and do not deposit thick gold layers. Such high temperatures are often incompatible with some electronics packaging materials. Hybrid electroless gold baths that do not automatically deposit gold and do not solely deposit gold by displacement plating have been proposed. While such hybrid gold baths may overcome problems of prior art electroless and immersion gold plating baths, the resulting gold deposits are not sufficiently adherent to substrates, such as nickel or nickel-coated substrates.

European Patent EP 1 021 593 B1 (Backus et al.) discloses an electroless gold plating bath that is particularly suitable for depositing gold on palladium In this patent, gold layers are electrolessly deposited on continuous palladium layers as such plating baths fail to plate on other metals, such as nickel.

Thus, there is a need for methods of depositing sold layers having good adhesion to substrates, particularly to nickel or nickel-coated substrates, while overcoming the problems of conventional electroless gold plating baths.

SUMMARY OF THE INVENTION

It has been surprisingly found that highly adherent gold layers can be deposited on a substrate from an electroless, including immersion, gold plating bath. Such adherent gold layers are deposited by first contacting the substrate with at least a catalytic amount of palladium and then contacting the substrate with an electroless gold plating bath.

In one aspect, the present invention provides a method of depositing a gold layer on a metal comprising the steps of: a) contacting the metal with a palladium bath; and b) then contacting the metal with an electroless gold plating bath.

In another aspect, the present invention provides a method for improving the adhesion of an electrolessly deposited gold layer to a metal comprising the steps of: a) contacting the metal with a palladium bath; and b) then contacting the metal with an electroless gold plating bath.

In still another aspect, the present invention provides an article comprising in order a nickel layer; palladium seeds or a discontinuous palladium layer; and a gold layer. Such gold layer is typically electrolessly deposited.

In a further aspect, the present invention provides a method of manufacturing an electronic device comprising the steps of: a) contacting a metal layer disposed on an electronic device substrate with a palladium bath; and b) then contacting the metal layer with an electroless gold plating bath.

DETAILED DESCRIPTION OF THE INVENTION

As used throughout this specification, the following abbreviations shall have the following meanings, unless the context clearly indicates otherwise: ° C.=degrees Centigrade; ° F.=degrees Fahrenheit; g=gram; L=liter; mL=milliliter; μin=microinches; DI=deionized; and min=minutes. The terms "depositing" and "plating" are used interchangeably throughout this specification. "Alkyl" refers to linear, branched and cyclic alkyl. "Halide" refers to fluoride, chloride, bromide and iodide. Likewise, "halo" refers to fluoro, chloro, bromo and iodo. Unless otherwise indicated, aromatic compounds having two or more substituents include ortho-, meta- and para-substitution. All percentages are by weight, unless otherwise noted. All numerical ranges are inclusive and combinable in any order, except where it is obvious that such numerical ranges are constrained to add up to 100%.

The present invention provides a method of depositing a gold layer on a substrate such as a metal, comprising the steps of: a) contacting the metal with a palladium bath; and b) then contacting the metal with an electroless gold plating bath. The metal is typically contacted with a palladium bath for a time sufficient to deposit palladium on the surface of the metal. Any amount of palladium is sufficient to increase the adhesion of electrolessly deposited gold. Such palladium deposit may be a continuous layer of palladium on the metal, a discontinuous layer of palladium or may be palladium seeds deposited on the metal. By "palladium seeds" is meant discrete or isolated palladium deposits. By "discontinuous layer of palladium" is meant a layer of palladium that does not cover the entire platable surface of the underlying substrate or metal. A discontinuous layer of palladium is a layer of palladium-containing discontinuities or voids. It is preferred to deposit palladium seeds or a discontinuous palladium layer rather than a continuous palladium layer. In certain applications, a continuous palladium layer may be advantageous. The palladium deposits of the invention provide increased adhesion of subsequently electrolessly deposited gold layers.

Any palladium bath is suitable for use in the present invention provided that it contains palladium and an acid. Accordingly, electrolytic or electroless palladium plating baths may be used. When electrolytic plating baths are used, they are used without current. Preferred palladium baths are electroless palladium baths, more preferably immersion baths, and most preferably palladium catalyst baths. Such palladium catalyst baths are immersion palladium baths, are well known to those skilled in the art and typically contain a lower concentration of palladium than conventional electroless palladium plating baths. Suitable electroless palladium plating baths contain from 1 to 10 g/L of palladium as a soluble palladium salt, reducing agents, stabilizers and complexing agents. Suitable palladium catalyst baths contain at least 10 ppm, preferably at least 25 ppm, and more preferably at least 50 ppm of palladium as palladium salt. Particularly suitable amounts of palladium in palladium catalyst baths are 50 to 200 ppm, and preferably 50 to 150 ppm as palladium salt. Any soluble palladium salt may be used such as, but not limited to, palladium halides such as palladium chloride, palladium acetate, palladium gluconate, palladium amine halides such as palladium tetrammine chloride, palladium citrate, palladium tartrate and the like. It is preferred that the palladium salt is palladium tetrammine chloride. Such palladium catalyst plating baths also contain acid, preferably mineral acids, and solvent such as water. Suitable palladium baths are generally commercially available, such as under the Ronamerse SMT Catalyst trademark, available from Shipley Company, Marlborough, Mass.

The palladium plating baths of the present invention may be used at a variety of temperatures, such as from below room temperature (ca. 20° C.) to about 60° C. Typical temperature ranges are from 23° to 60° C., and preferably from 25° to 58° C.

The metal is contacted with the palladium bath for a period of time sufficient to deposit sufficient palladium to provide a subsequently electrolessly deposited gold layer having improved adhesion as compared to a gold layer deposited without such palladium deposit. Typically, contact times of at least 5 seconds, preferably at least 10 seconds and more preferably at least 30 seconds are sufficient. Particularly suitable contact times are from 5 to 600 seconds, preferably 10 to 300 seconds and more preferably 30 to 180 seconds. Following contact with the palladium bath, the metal is optionally rinsed, such as with water, prior to gold plating.

Any electroless gold plating bath may be used in the present invention. In general, electroless gold plating baths contain water, one or more soluble gold compounds, one or more complexing agents, uniformity enhancers, and optionally one or more reducing agents.

Any of a wide variety of water soluble gold compounds that provide gold (I) to the plating bath may be used in the present invention. Suitable gold compounds include, but are not limited to, alkali gold thiosulfate compounds such as trisodium gold thiosulfate and tripotassium gold thiosulfate; alkali gold sulfite compounds such as sodium gold sulfite and potassium gold sulfite; ammonium gold sulfite; gold halides such as gold chloride; alkali gold cyanide compounds such as sodium gold cyanide and potassium gold cyanide; and ammonium gold cyanide. However, it is preferred that the present compositions are substantially free of cyanide ions and sulfite ions. By "substantially free" it is meant that the present compositions contain less than 0.05 g/L of such ions. It is further preferred that the present compositions are free of cyanide ions and sulfite ions.

It will be appreciated by those skilled in the art that the water-soluble gold salt may be added to the electrolyte composition directly or generated in situ. For example, potassium gold cyanide may be prepared in situ in the electrolyte composition by adding to water an amount of water-insoluble gold cyanide and an amount of potassium cyanide to form the water-soluble potassium gold cyanide.

The total amount of the one or more water soluble gold compounds is typically from 0.1 to 60 g/L. Preferably, the gold compounds are present in an amount of 0.5 to 15 g/L, and more preferably 0.5 to 5 g/L. Such water soluble gold compounds are generally commercially available from a variety of suppliers or may be prepared by methods well known in the art.

When a true electroless (autocatalytic) gold plating bath is desired, a reducing agent is typically used. Any reducing agent which acts as an oxidant in preference to the oxidation of nickel or which is capable of minimizing the tendency for bipolar attach of the nickel layer is useful in the present invention. Suitable reducing agents would be clear to those skilled in the art and included, but are not limited to, any of a wide variety of inorganic compounds, nitrogen-containing compounds and derivatives thereof, organic compounds and derivatives thereof, or mixtures thereof having antioxidant activity. Preferred nitrogen-containing compounds include hydrazine hydrate and hydrazine sulfate, and hydroxylamine and salts or other derivatives thereof such as hydroxylamine, sulfate, hydroxylamine chloride and hydroxylamine phosphate. The salt or other forms of these compounds that are readily soluble in the electrolyte solution are preferred. Other suitable nitrogen bearing compounds include nitrogen compound salts where the nitrogen is not in its highest oxidation state. Suitable compounds of this type include, but are not limited to, nitrites or nitride-containing compounds. Of these, alkali metal nitrites such as potassium nitrite and sodium nitrite and sodium nitrite are preferred. Additional suitable reducing agents include organic antioxidants such as ascorbic acid, ascorbates and derivatives thereof, tocopherols and derivates thereof, and formic acid, formats and their derivatives.

A wide variety of gold complexing agents may be used in the present invention. Suitable gold complexing agents include, but are not limited to, thiosulfuric acid, thiosulfate salts such as sodium thiosulfate, potassium thiosulfate, and ammonium thiosulfate, ethylenediamine tetraacetic acid and its salts, nitrilotriacetic acid, and the like. Thiosulfuric acid and thiosulfate salts are preferred. Most preferred is sodium thiosulfate.

When thiosulfate ion is used, it can be supplied in any solution soluble form, such as an alkali thiosulfate (e.g., sodium or potassium) or ammonium thiosulfate, with sodium thiosulfate pentahydrate being the most economical and readily available source.

Such one or more complexing agents are typically present in a total amount of 0.1 to 150 g/L, and preferably from 1 to 100 g/L. A more preferred amount of complexing agent is from 5 to 75 g/L, and still more preferably from 10 to 60 g/L. The one or more complexing agents are generally commercially available or may be prepared from by methods well known in the art.

When thiosulfate is used as a complexing agent, it is preferred that one or more organic stabilizer compounds for the thiosulfate ion are present in the gold plating bath. The one or more organic stabilizer compounds useful in the present invention have the formula R—SO$_2$—Y wherein R is (C$_1$–C$_{18}$)alkyl, aryl, or heteroaryl and Y is hydrogen or a monovalent cation. Suitable monovalent cations for Y are alkali metals, such as sodium and potassium. It is preferred that Y is hydrogen. Exemplary alkyl groups for R include, but are not limited to, methyl, ethyl, n-propyl, iso-propyl, n-butyl, tert-butyl, iso-butyl, n-pentyl, neo-pentyl, hexyl, octyl and decyl. Typical aryl groups are those containing 5 to 14 atoms in the aromatic rings. Suitable aryl groups include, but are not limited to: phenyl; (C$_1$–C$_6$)alkylaryl such as tolyl and xylyl; naphthyl; and bisphenol A. Suitable heteroaryl groups include, but are not limited to, furanyl, pyridyl, thiophenyl, and the like. It is preferred that R is an aryl group, and more preferably phenyl.

It will be appreciated by those skilled in the art that substituted (C$_1$–C$_{18}$)alkyl, aryl, or heteroaryl are within the scope of this invention. By "substituted (C$_1$–C$_{18}$)alkyl, aryl, or heteroaryl", it is meant that one or more hydrogens on the (C$_1$–C$_{18}$)alkyl, aryl, or heteroaryl group is replaced by one or more substituents groups. Suitable substituents groups include, but are not limited to, halo, hydroxy, (C$_1$–C$_6$) alkoxy, carb(C$_1$–C$_6$)alkoxy, nitro, thio, (C$_1$–C$_6$)alkylthio, and the like.

In general, the one or more organic stabilizer compounds are used in an amount of at least 0.5 g/L, preferably at least 1 g/L. The practical upper limit of the amount of the one or more organic stabilizer compounds is the saturation limit of such compounds in the composition. Preferably, the one or more organic stabilizer compounds are used in an amount of 2 g/L to 25 g/L and more preferably from 3 to 15 g/L. A particularly suitable amount of organic stabilizer compound is 3 to 10 g/L. Such organic stabilizer compounds are generally commercially available or may be prepared by methods well known in the art.

While not intending to be bound by theory, it is believed that the organic stabilizer compounds stabilize the electroless gold plating compositions, particularly when thiosulfate ion is used, under mildly acidic conditions, such that the solution does not break down on standing and does not liberate any appreciable amounts of sulfur dioxide in the case of thiosulfate ion.

One or more uniformity enhancers may be added to the gold plating baths. Such uniformity enhancers are typically organic carboxylic acids capable of providing chelation. While not wishing to be bound by theory, such uniformity enhancers may additionally act as mild reducing agents. These uniformity enhancers have been found to provide a more uniform gold deposit than that provided by compositions that do not contain such compounds. Suitable uniformity enhancers include polycarboxylic acids such as di- and tri-carboxylic acid compounds, hydroxy-substituted carboxylic acid compounds, and the like. It is preferred that the uniformity enhancer is a di-carboxylic acid. Exemplary uniformity enhancers include, but are not limited to, oxalic acid, ascorbic acid, citric acid, malic acid, glycolic acid, malonic acid, lactic acid, oxalactic acid and tartaric acid. Other suitable uniformity enhancers include phthalic acid, adipic acid, succinic acid and glutaric acid. Preferred uniformity enhancers are oxalic acid, malonic acid, ascorbic acid, and citric acid. Oxalic acid is the most preferred uniformity enhancer.

In general, the one or more uniformity enhancers are used in an amount of 0.1 to 50 g/L, and preferably from 1 to 15 g/L. A particularly suitable amount of uniformity enhancer is from 2 to 8 g/L.

Preferred gold plating bath compositions include a) 0.5 to 15 g/L of one or more alkali metal gold thiosulfate compounds; b) 1 to 100 g/L of one or more gold complexing agents selected from the group consisting of thiosulfuric acid or an alkali metal thiosulfate salt; c) 2 g/L to 25 g/L of one or more organic stabilizer compounds of the formula R—SO$_2$—Y wherein R is (C$_1$–C$_{18}$)alkyl, aryl, or heteroaryl and Y is hydrogen or a monovalent cation; and d) 1 to 15 g/L of oxalic acid.

The gold plating compositions may further include a pH regulating compound. Any pH regulating compound may be used provided that it does not adversely affect the stability or performance of the composition. Suitable pH regulating compounds include phosphates such as dihydrogen potassium phosphate monohydrogen dipotassium phosphate, tripotassium phosphate, boric acid, and the like. The amount of such pH regulating compound used depends upon the desired pH to be maintained and the specific pH regulating compound selected. For example, dihydrogen potassium phosphate is typically used in an amount of 1 to 50 g/L, and preferably from 5 to 25 g/L. In general, the present compositions are maintained at a pH 3 to 9, preferably 4 to 8 and preferably from 5 to 7.5.

The compositions generally include water. Any grade of water is suitable, but deionized is preferred.

Gold plating compositions of the present invention may optionally contain one or more other additives, such as surfactants. Anionic and nonionic surfactants are the preferred surfactants, and anionic surfactants are more preferred. Suitable anionic surfactants include phosphate esters such as phosphate esters of aliphatic alcohols including phosphate esters of glycerides, and preferably phosphate esters of long chain aliphatic alcohols. Suitable anionic phosphate ester surfactants include those sold under the RHODAFAC and EMPHOS trademarks, available from Rhodia and Crompton Corporation, respectively. Such surfactants are typically used in an amount of 0.1 to 2 g/L.

Such gold plating compositions may be prepared by combining the above components in any order. It is preferred that when gold chloride is used, it is added to the compositions after the gold complexing agents, organic stabilizer compounds and uniformity enhancers are added to the composition. Preferably, the pH of the composition is maintained at $\geq 5$ during the addition of the gold chloride. The pH may be maintained, for example, by the addition of hydroxide, such as potassium hydroxide.

In general, such gold plating baths are heated during use, typically from 25° to 95° C. Preferably, the present baths are heated from 30° to 90°, and more preferably from 45° to 80° C.

The thickness of the desired gold deposit on a substrate can be controlled by controlling the amount of time the substrate is in contact with the present plating compositions.

The present invention is particularly suited for depositing gold on a wide variety of substrates, particularly on a metal that is less electropositive than gold, i.e. a traditional immersion plating approach. Typical metals that are less electropositive than gold include, but are not limited to, nickel, copper, and iron. More than one metal that is less electropositive than gold may be used. For example, a layer of nickel on a layer of copper is a suitable substrate for depositing gold according to the present invention. Thus, the present invention further provides a method for depositing gold on a metal that is less electropositive than gold including contacting a substrate containing a metal that is less electropositive than gold with a palladium bath and then contacting the substrate with an electroless gold plating bath.

The present invention is particularly useful in the manufacture of electronic devices, such as printed wiring boards, integrated circuits, integrated circuit packaging and the like. The present invention provides a method of manufacturing an electronic device comprising the steps of: a) contacting a metal layer disposed on an electronic device substrate with a palladium bath; and b) then contacting the metal layer with an electroless gold plating bath. In an alternate embodiment, a gold layer can be deposited by a method including the step of contacting an electronic device substrate with a palladium bath for a period of time sufficient to deposit palladium seeds or a discontinuous palladium layer and then contacting the substrate with an electroless gold plating composition including: a) one or more water soluble gold compounds; b) one or more gold complexing agents; c) one or more organic stabilizer compounds of the formula R—SO$_2$—Y wherein R is ($C_1$–$C_{18}$)alkyl, aryl, or heteroaryl and Y is hydrogen or a monovalent cation; and d) and one or more uniformity enhancers; for a period of time sufficient to deposit the desired gold layer. Particularly suitable integrated circuit packaging include, but is not limited to, lead frames, pads on wafers, ceramic packages, and the like. The present invention is also suitable for applying a solderable gold finish on a printed circuit board or depositing gold on an integrated circuit.

An advantage of the present invention is that a catalytic deposit of palladium, on a substrate either as palladium seeds or a discontinuous palladium layer, provides a subsequently electrolessly deposited gold layer having very good adhesion, as compared to gold deposited on the substrate without a catalytic palladium deposit. This is especially the case when the substrate is nickel. Surprisingly, a continuous layer of palladium on the substrate is not necessary to provide a highly adherent gold layer.

The following examples are intended to illustrate further various aspects of the present invention, but are not intended to limit the scope of the invention in any aspect.

EXAMPLE 1

Gold plating baths were prepared by combining the components in Table 1 in the amounts shown.

TABLE 1

| Component | Amount (g/L) |
| --- | --- |
| Gold as AuNa$_3$O$_6$S$_4$ or HAuCl$_4$ | 1 |
| Sodium thiosulfate | 50 |
| Benzene sulfinic acid | 10 |
| Dihydrogen potassium phosphate | 15 |
| Oxalic acid | 5 |
| Water | To 1 L |

The pHs of the baths were approximately 5.5. The temperature of the baths was maintained at 120° F. (ca. 49° C).

EXAMPLE 2

Acid copper plated FR4 coupons (1 in.×0.5 in.) were plated with nickel using a commercially available electroless nickel product (EVERON™ SMT electroless nickel, available from the Shipley Company, Marlborough, Mass.). Standard plating conditions were used (190° F.) to deposit nickel at a rate of 12 μin/min. Following electroless nickel plating, the nickel coating was rinsed.

After rinsing, the nickel coated FR4 coupons were then contacted with a palladium catalyst bath (Ronamerse SMT catalyst available from Shipley Company) for 1 minute. The palladium catalyst bath contained 100 ppm of palladium as palladium tetrammine chloride, 170 mL/L hydrochloric acid and 730 mL/L DI water. After contact with the palladium bath, the samples only contained barely visible palladium deposits and did not contain a full layer of palladium over the entire surface. Thus, only palladium seeds were deposited on the nickel layer. The samples were next contacted the gold plating bath of Example 1. Gold was deposited on the nickel at a rate of 2 μin/min. After gold plating, the substrate was removed from the plating bath, rinsed and dried. The gold deposits were analyzed and found to be 4 to 7 μin thick.

EXAMPLE 3

The procedure of Example 2 was repeated except that the samples were not contacted with the palladium plating catalyst bath prior to gold plating.

EXAMPLE 4

The adhesion of the gold layer deposited on the plated FR4 samples was evaluated using a conventional tape test. Transparent tape (Scotch brand available from 3M, St. Paul, Minn.) was applied to samples prepared according to Examples 2 (invention) and 3 (comparative). The tape was pressed down on the samples to provide good adhesion to the gold layer. The tape was then removed and examined for the presence of gold adhering to the tape. The tape removed from the samples of Example 2 contained no gold. Therefore, all of the gold remained on the plated $FR_4$ samples indicating a highly adherent gold deposit. The tape removed from the samples of Example 3 did contain gold. Therefore, gold was removed from the plated samples indicating poor adhesion of the gold deposit. As can be seen for the data, contacting nickel plated samples with a palladium plating bath prior to electrolessly depositing gold provides highly adherent gold deposits.

EXAMPLE 5 (COMPARATIVE)

An aluminum pad on a wafer was plated with nickel using a commercially available electroless nickel product (EVERON™ BP electroless nickel, available from the Shipley Company, Marlborough, Mass.). Standard plating conditions were used (185° to 190° F.) to deposit nickel at a rate of 10 to 12 μin/min. Following electroless nickel plating, the nickel coating was rinsed.

After rinsing, the nickel coated aluminum substrate was then contacted with the gold plating bath of Example 1. Gold was deposited on the nickel at a rate of approximately 2 μin/min. After gold plating, the substrate was removed from the plating bath, rinsed and dried.

EXAMPLE 6

The procedure of Example 5 was repeated except that after nickel plating and before gold plating, the wafer pad was contacted with the palladium catalyst bath of Example 2 for 1 minute. After contact with the palladium bath, the wafer pads only contained barely visible palladium deposits and did not contain a full or complete layer of palladium over the entire surface. Thus, only palladium seeds were deposited on the nickel layer. After contact with the palladium bath, the wafer pads were contacted with a gold plating bath according to Example 5.

EXAMPLE 7

The adhesion of the gold layer on the plated wafer pads of Examples 5 to 6 was evaluated using the tape test of Example 4. The tape removed from the plated wafer pads of Example 5 did contain gold. Therefore, gold was removed from the wafer pads indicating poor adhesion. The tape removed from the plated wafer pads of Example 6 contained no gold. Therefore, all of the gold remained on the plated wafer pads indicating a highly adherent gold deposit. As can be see from the data, contacting nickel plated samples with a palladium plating bath for a time sufficient to deposit palladium seeds prior to electrolessly depositing gold provides highly adherent gold deposits.

While the invention has been described in detail with reference to specific embodiments thereof, it will be apparent to one skilled in the art that various changes and modifications can be made, and equivalents employed, without departing from the scope of the claims.

What is claimed is:

1. A method of depositing a gold layer on a metal comprising the steps of: a) contacting the metal with a palladium bath for a period of time sufficient to deposit palladium seeds or a discontinuous palladium layer on the metal; and b) then contacting the metal with an electroless gold plating bath, the electroless gold plating bath comprises one or more organic stabilizer compounds of the formula R—$SO_2$—Y wherein R is ($C_1$–$C_{18}$)alkyl, aryl, or heteroaryl and Y is hydrogen or a monovalent cation.

2. The method of claim 1 wherein the period of time is from 5 to 600 seconds.

3. The method of claim 1 wherein the period of time is from 10 to 300 seconds.

4. The method of claim 1 wherein the palladium bath contains at least 25 ppm of palladium.

5. The method of claim 1 wherein the palladium bath contains from 50 to 200 ppm of palladium.

6. The method of claim 1 wherein the electroless gold plating bath further comprises:

a) one or more water soluble gold compounds;

b) one or more gold complexing agents; and c) one or more uniformity enhancers.

7. The method of claim 6 wherein the gold compound is an alkali metal gold thiosulfate compound.

8. A method for manufacturing an electronic device comprising the steps of: a) contacting a metal layer disposed on an electronic device substrate with a palladium bath for a period of time sufficient to deposit palladium seeds or a discontinuous palladium layer on the metal; and b) then contacting the metal layer with an electroless gold plating bath, the electroless gold plating bath comprises one or more organic stabilizer compounds of the formula R—$SO_2$—Y wherein R is ($C_1$–$C_{18}$)alkyl, aryl, or heteroaryl and Y is hydrogen or a monovalent cation.

9. The method of claim 8 wherein the period of time is from 5 to 600 seconds.

10. The method of claim 8 wherein the electroless gold plating bath comprises:

a) one or more water soluble gold compounds;

b) one or more gold complexing agents; and c) one or more uniformity enhancers.

* * * * *